US011308661B2

(12) United States Patent
Daniel et al.

(10) Patent No.: US 11,308,661 B2
(45) Date of Patent: Apr. 19, 2022

(54) MOTION ROBUST RECONSTRUCTION OF MULTI-SHOT DIFFUSION-WEIGHTED IMAGES WITHOUT PHASE ESTIMATION VIA LOCALLY LOW-RANK REGULARIZATION

(71) Applicant: The Board of Trustees of the Leland Stanford Junior University, Stanford, CA (US)

(72) Inventors: Bruce L. Daniel, Stanford, CA (US); Brian A. Hargreaves, Menlo Park, CA (US); Yuxin Hu, Stanford, CA (US); Evan G. Levine, Redwood City, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 290 days.

(21) Appl. No.: 16/416,700

(22) Filed: May 20, 2019

(65) Prior Publication Data
US 2019/0355157 A1    Nov. 21, 2019

Related U.S. Application Data

(60) Provisional application No. 62/674,217, filed on May 21, 2018.

(51) Int. Cl.
*G06T 11/00*    (2006.01)
*G01R 33/561*    (2006.01)
(Continued)

(52) U.S. Cl.
CPC .......... *G06T 11/006* (2013.01); *G01R 33/443* (2013.01); *G01R 33/5602* (2013.01);
(Continued)

(58) Field of Classification Search
CPC .............. G01R 33/443; G01R 33/5602; G01R 33/5608; G01R 33/5611; G01R 33/5616;
(Continued)

(56) References Cited

U.S. PATENT DOCUMENTS 7,205,763 B2    4/2007    Porter
7,860,291 B2    12/2010    Hwang
2014/0002078 A1    1/2014    Chen

FOREIGN PATENT DOCUMENTS

CN    106780643 A    5/2017

OTHER PUBLICATIONS

Mani, et al. Multi-Shot Sensitivity-Encoded Diffusion Data Recovery Using Structured Low-Rank Matrix Completion, Magn Reson Med. Aug. 2017; 78(2): 494-507 (Year: 2017).*

* cited by examiner

*Primary Examiner* — Steven L Yeninas
(74) *Attorney, Agent, or Firm* — Lumen Patent Firm

(57) ABSTRACT

Multi-shot diffusion-weighted magnetic resonance imaging acquires multiple k-space segments of diffusion-weighted MRI data, estimates reconstructed multi-shot diffusion weighted images, and combines the estimated images to obtain a final reconstructed MRI image. The estimation of images iteratively calculates updated multi-shot images from the multiple k-space segments and current multi-shot images using a convex model without estimating motion-induced phase, constructs multiple locally low-rank spatial-shot matrices from the updated multi-shot images, and calculates current multi-shot images from spatial-shot matrices.

9 Claims, 4 Drawing Sheets

(51) Int. Cl.
*G01R 33/563* (2006.01)
*G01R 33/44* (2006.01)
*G01R 33/56* (2006.01)
*G06T 7/262* (2017.01)

(52) U.S. Cl.
CPC ..... *G01R 33/5608* (2013.01); *G01R 33/5616* (2013.01); *G01R 33/56341* (2013.01); *G06T 7/262* (2017.01); *G06T 2207/10088* (2013.01); *G06T 2207/20216* (2013.01); *G06T 2210/41* (2013.01); *G06T 2211/424* (2013.01)

(58) Field of Classification Search
CPC . G01R 33/56341; G06T 7/262; G06T 11/006; G06T 2207/10088; G06T 2207/20216
See application file for complete search history.

MOTION ROBUST RECONSTRUCTION OF MULTI-SHOT DIFFUSION-WEIGHTED IMAGES WITHOUT PHASE ESTIMATION VIA LOCALLY LOW-RANK REGULARIZATION

CROSS-REFERENCE TO RELATED APPLICATIONS

This application claims priority from U.S. Provisional Patent Application 62/674,217 filed May 21, 2018, which is incorporated herein by reference.

STATEMENT REGARDING FEDERALLY SPONSORED RESEARCH OR DEVELOPMENT

This invention was made with Government support under contract P41 EB015891, R01 EB009055, and R01 EB009690 awarded by the National Institutes of Health. The Government has certain rights in the invention.

FIELD OF THE INVENTION

The invention relates generally to methods for magnetic resonance imaging. More specifically, it relates to high-resolution diffusion-weighted imaging.

BACKGROUND OF THE INVENTION

As a non-invasive imaging method, diffusion-weighted MRI has been widely used in clinical applications and neuroscience applications. Single-shot echo planar imaging (EPI) is the most commonly used method because of its fast acquisition speed and immunity to motion. It is, however, limited by image blurring and distortion due to the long readout window. Multi-shot EPI can provide high-resolution diffusion-weighted images (DWIs) with reduced distortion. Unfortunately, significant aliasing artifacts and signal cancellation may exist due to the mismatch of the motion-induced phase between different shots. The reconstruction becomes non-convex and intractable to solve when this phase is included in the forward model.

Many methods have been developed to estimate the motion-induced phase. These methods can be classified into two categories. One uses a self-navigator or extra-navigators to estimate the phase of each individual shot. Unfortunately, acquisition of the navigator data increases scan time. Furthermore, there might be a mismatch between the extra-navigator and the data to be reconstructed. The other category uses parallel imaging to reconstruct each shot separately, and the low-resolution results are used as phase estimation. This approach was further developed to jointly estimate the phase and the image. The phase estimation with these methods becomes very challenging when the number of shots is high and performance tends to depend on the geometry of the array coil used for signal reception. The phase estimation might fail in case of high-frequency phase variations due to large motion.

BRIEF SUMMARY OF THE INVENTION

Disclosed herein is a motion-robust reconstruction method for diffusion-weighted MRI that resolves shot-to-shot phase mismatches without using phase estimation. This approach solves the motion-induced phase mismatch problem for multi-shot diffusion-weighted imaging (DWI), so that high resolution diffusion-weighted images can be reconstructed with fewer distortions and higher SNR. This approach bypasses the challenging phase estimation step by using a relaxed model while still exploiting inter-shot dependencies. Specifically, locally low-rank multi-shot matrices are constructed to make use of the relationship between different shots for reconstruction of a multi-shot DWI image without phase estimation. The spatial multi-shot matrices are formed using a local group of pixels to form columns, where each column is from a different shot (excitation). A convex model with a locally low-rank constraint on the spatial-shot matrices is used for iterative reconstruction.

Compared with state-of-the-art reconstruction methods for multi-shot DWI, such as POCSMUSE and POCSICE, instead of solving a non-convex optimization problem, this approach avoids the challenging phase estimation step by using a relaxed model while still exploiting inter-shot dependencies. This approach does not need an extra navigator to estimate the motion-induced phase thus the acquisition time and SAR is reduced.

The motion robustness of the technique has the capability of handling big phase variations and shows significant benefits when the motion is severe, such as in neuroimaging and body imaging.

Compared with k-space-based block-Hankel low-rank matrix completion, the approach has a computational advantage since the spatial-shot matrices are small and non-overlapping.

Further, the reconstructed images using this technique can be used for reliable phase estimation in the context of phase-estimation-based methods to achieve even higher image quality.

In one aspect, the invention provides a method for multi-shot diffusion-weighted magnetic resonance imaging, the method comprising a) acquiring with a magnetic resonance imaging system multiple k-space segments of diffusion-weighted MRI data; b) estimating reconstructed multi-shot diffusion weighted images by iteratively performing steps comprising: i) calculating updated multi-shot images from the multiple k-space segments and current multi-shot images using a convex model without estimating motion-induced phase; ii) constructing multiple locally low-rank spatial-shot matrices from the updated multi-shot images; and iii) calculating the current multi-shot images from the spatial-shot matrices; and c) combining the reconstructed multi-shot diffusion weighted images to obtain a reconstructed MRI image.

The diffusion-weighted MRI data is preferably acquired in response to an echo planar imaging sequence after applying diffusion encoding gradients. The echo planar imaging sequence is preferably a 2D single-refocused Stejskal-Tanner spin-echo planar imaging sequence.

Constructing each of the spatial-shot matrices from the updated multi-shot image preferably comprises calculating a low-rank approximation by doing singular value decomposition (SVD) and soft-thresholding.

Each of the spatial-shot matrices preferably corresponds to a spatial block in an imaging plane, where each column of the matrix corresponds to a different shot of the multiple k-space segments.

Calculating updated multi-shot images preferably uses a sampling operator, a Fourier transform, and an encoding operator constructed from sensitivity maps, and their conjugate operators, and the acquired data, where the sensitivity maps preferably are estimated from T2 images acquired without applying diffusion encoding gradients.

The method may further comprise flipping and conjugating the multiple k-space segments of diffusion-weighted MRI data and treating them as virtual shots. The method may further comprise estimating sensitivity maps for virtual shots from conjugated T2 images.

DETAILED DESCRIPTION OF THE INVENTION

Embodiments disclose a locally low-rank reconstruction approach to reconstruct images in multi-shot diffusion-weighted imaging (DWI). Locally low-rank (LLR) regularization takes advantages of the smoothness of sensitivity maps for calibration-less parallel imaging reconstruction, or similarities between images at different time points for dynamic imaging. In the present approach, we use locally low-rank regularization to reconstruct multi-shot DWI based on the assumption that the motion-induced phase is spatially smooth in most regions. The image is parameterized by multiple images from each shot rather than motion-induced phase and one single image, so that the phase estimation is not necessary. This enables the reconstruction to be formulated as a convex optimization problem which is easy to solve and guaranteed to converge to the global minimum.

Figure 1:
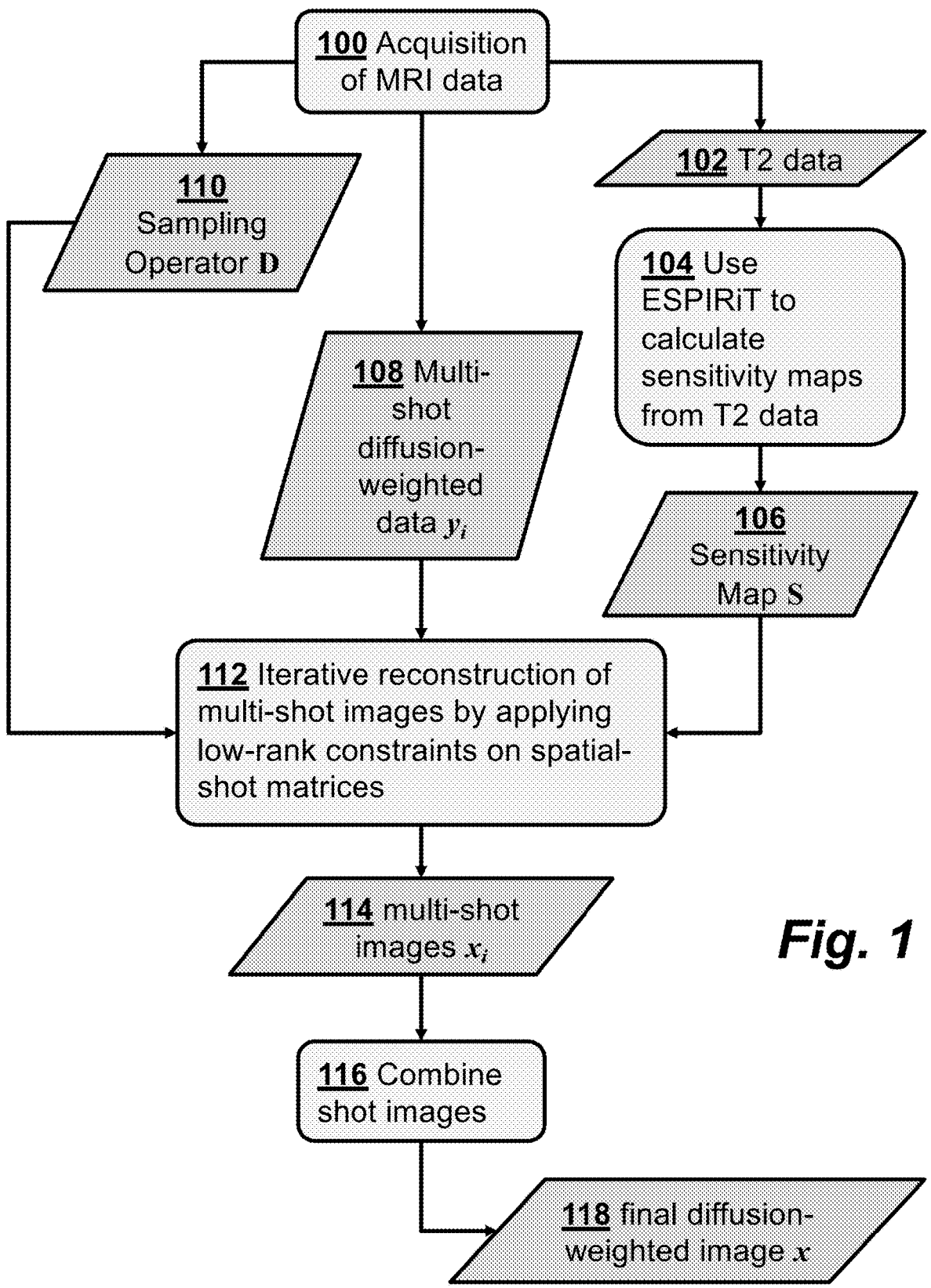
FIG. 1 is a flowchart illustrating an overview of a method for MRI imaging according to an embodiment of the invention.

FIG. 1 is a flowchart illustrating an overview of a method for MRI imaging according to an embodiment of the invention. In step 100, an MRI system acquires k-space data including T2 imaging data 102 and diffusion-weighted (high b-value) multi-shot data 108. In step 104 sensitivity maps 106 are estimated from the low-frequency components of the T2 data 102 using ESPIRiT. The acquisition 100 also produces sampling operator 110.

Step 112 uses a convex model to iteratively estimate multi-shot images 114 from the multi-shot data 108, sensitivity maps 106, and sampling operator 110, where the challenging phase estimation step is bypassed by treating each image segment (i.e., shot) as a separate image.

In step 116, the multi-shot images 114 reconstructed by iterative estimation 112 are combined to produce a final diffusion-weighted image 118. The multi-shot images may be combined, for example, by removing the low-resolution phase of each image, and performing a complex sum of the resulting images. Alternatively, the multi-shot images may be combined by taking the root sum of square of images of all shots.

The acquisition 100 and iterative reconstruction 112 will now be described in further detail in relation to FIG. 2 and FIG. 3, respectively.

Figure 2:
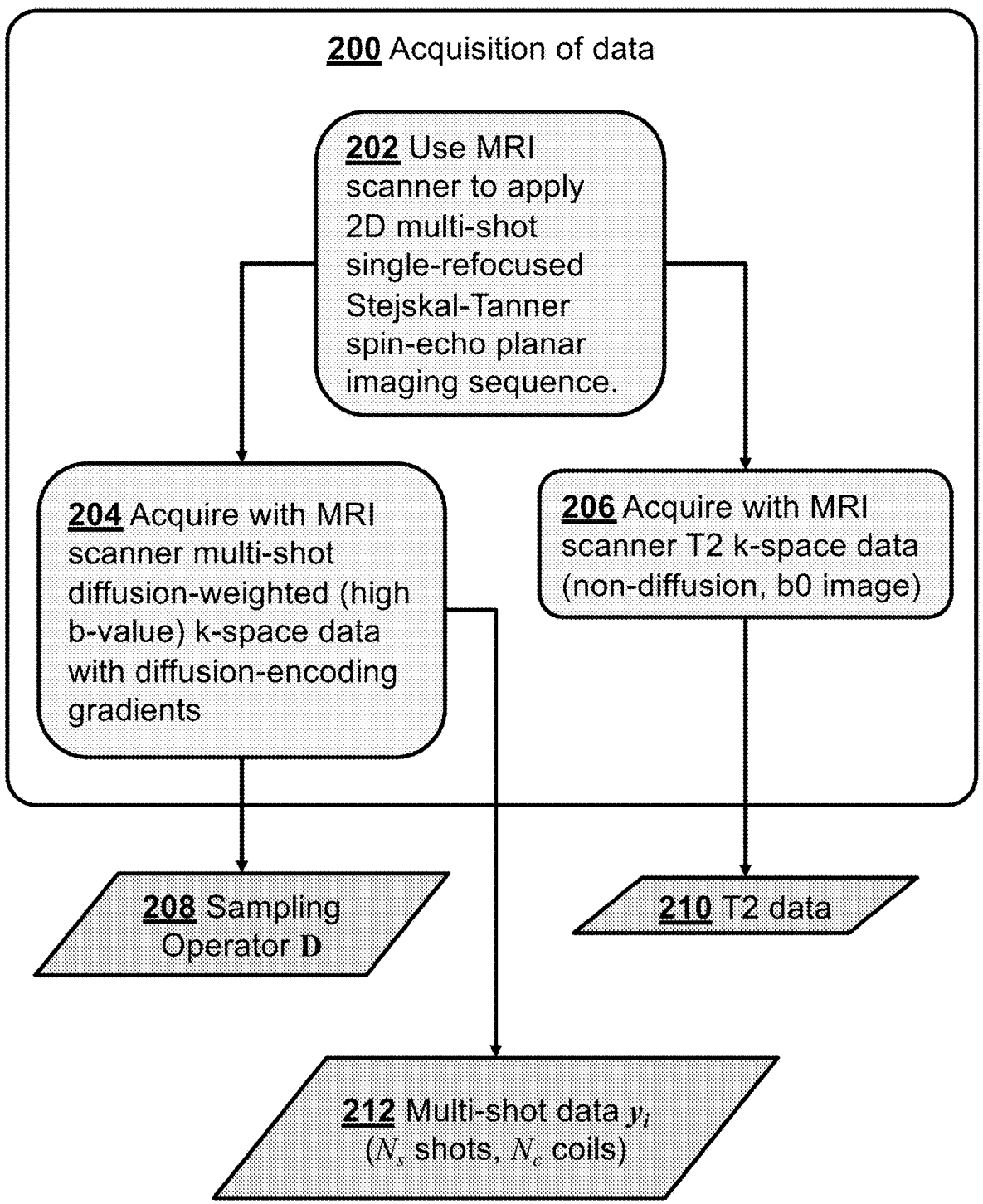
FIG. 2 is a flowchart illustrating steps of MRI image acquisition for a patient scan according to an embodiment of the invention.

FIG. 2 is a flowchart illustrating steps of MRI image acquisition for a patient scan according to an embodiment of the invention. The MRI acquisition 200 produces T2 data 210, multi-shot data 212, and sampling operator 208.

Figure 4:
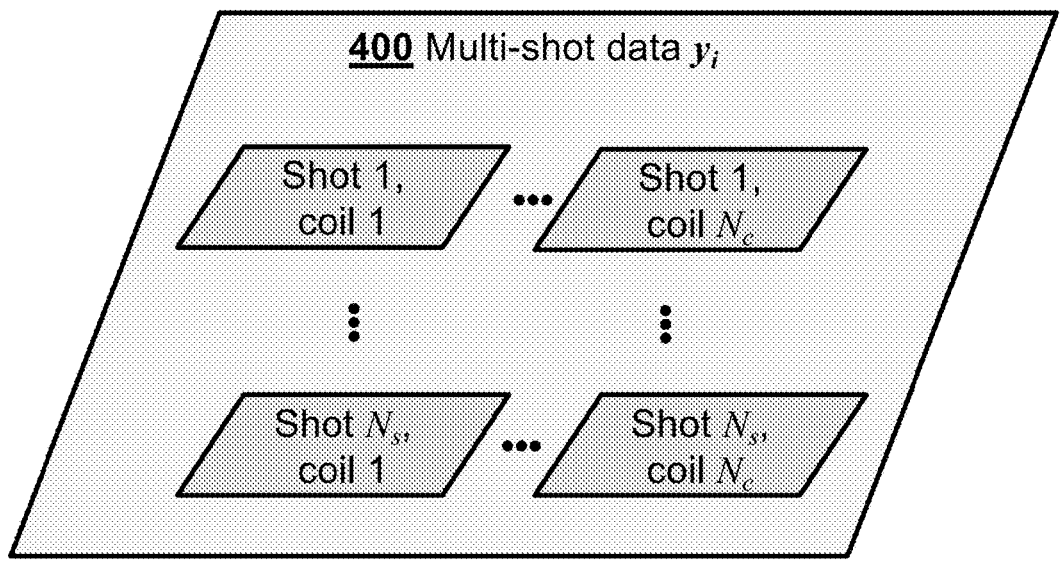
FIG. 4 shows multi-shot data including a collection of $N_s$ shots from each of $N_c$ coils, for a total of $N_s \times N_c$ shots according to an embodiment of the invention.

In step 202, the MRI system generates a 2D multi-shot single-refocused Stejskal-Tanner spin-echo planar imaging sequence within imaging region. In response to excitations of the imaging sequence, RF coils of the MRI system are used in step 206 to acquire T2 data 210 which have a b-value of 0. This T2 data is acquired without applying diffusion encoding gradients. In step 204, diffusion-encoding gradients are added and the RF coils are used to acquire diffusion-weighted (high b-value, i.e., b>100) multi-shot MRI data 212. The multi-shot data 212 includes a collection of $N_s$ shots from each of $N_c$ coils, for a total of $N_s \times N_c$ shots, as illustrated by the multi-shot data 400 in FIG. 4. Step 204 also produces sampling operator 208.

Optionally, using a virtual conjugate shot concept, the acquired data 210 and 212 may be flipped and conjugated and then treated as virtual shots. Corresponding virtual sensitivity maps can be estimated from the conjugated T2 data.

Figure 3:
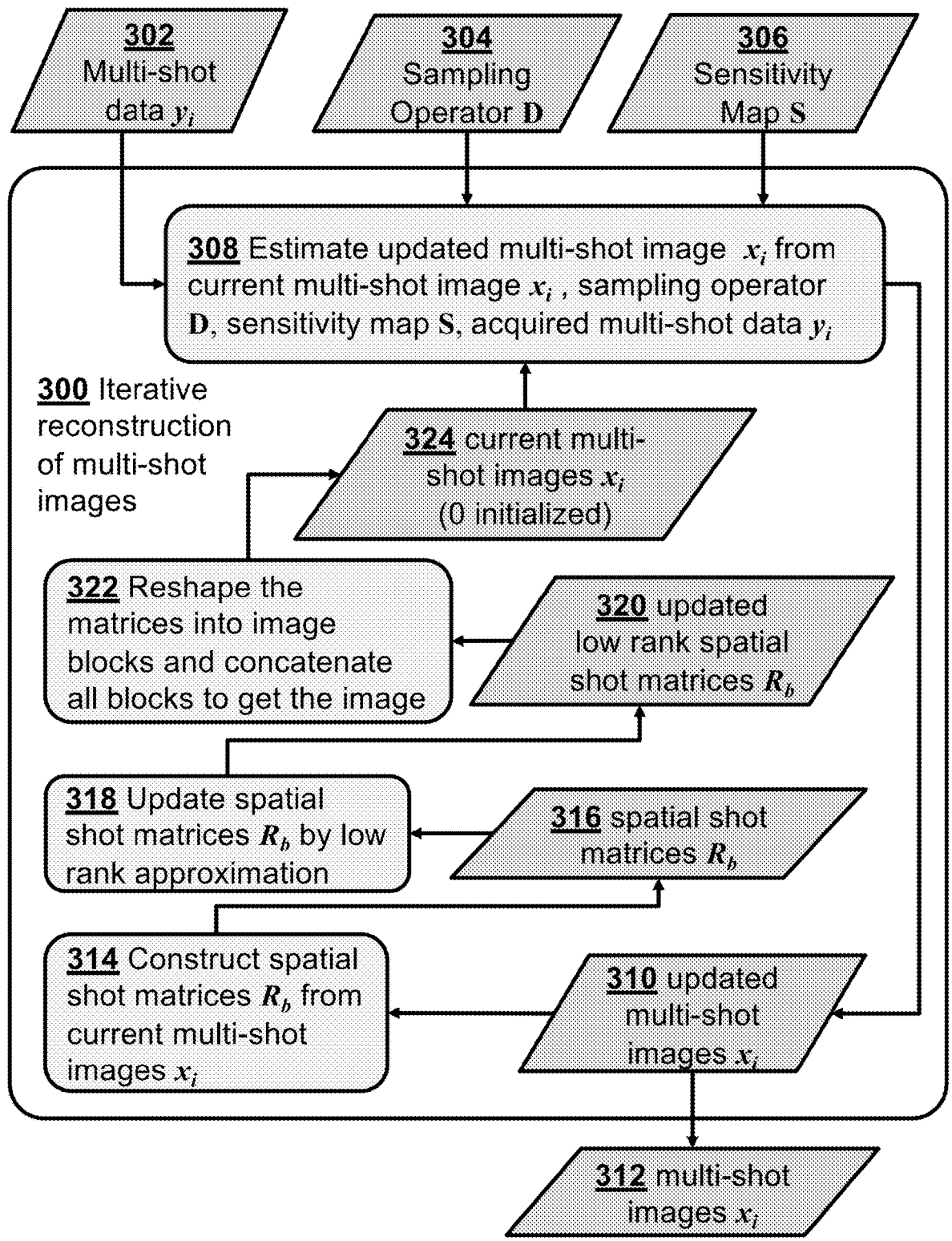
FIG. 3 is a flowchart illustrating steps of iterative reconstruction of multi-shot images according to an embodiment of the invention.

FIG. 3 is a flowchart illustrating steps of iterative reconstruction of multi-shot images according to an embodiment of the invention. The iterative reconstruction 300 uses multi-shot data 302, sampling operator 304, and sensitivity map 306 to reconstruct a collection of multi-shot images 312.

Each iteration includes the following steps: In step 308, updated multi-shot images 310 are calculated from current multi-shot images 324 based on the acquired multi-shot data 302, sampling operator 304, and sensitivity maps 306. The update uses a convex model, as will be described in more detail below.

Figure 5:
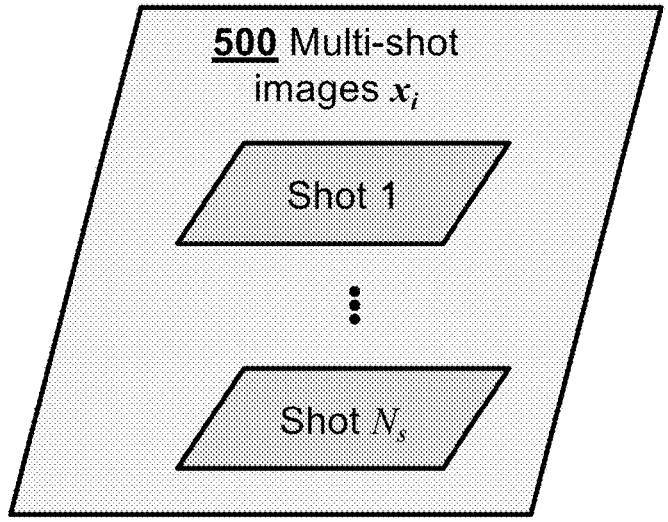
FIG. 5 shows a collection of multi-shot images having $N_s$ shots according to an embodiment of the invention.
Figure 6:
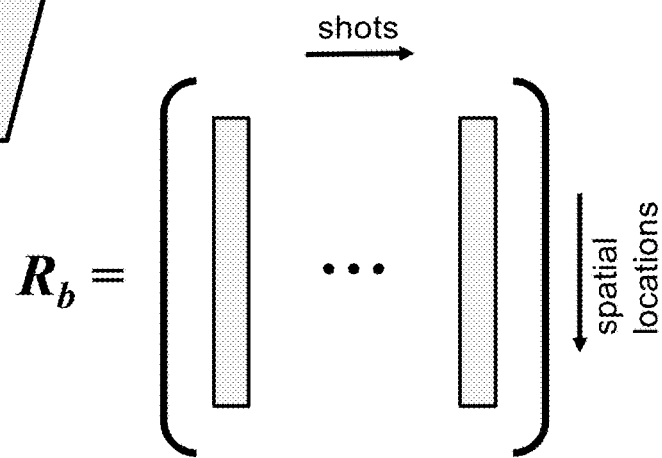
FIG. 6 shows a corresponding matrix whose $N_s$ columns correspond to the $N_s$ shots according to an embodiment of the invention.

The updated multi-shot images 310 are then used to generate current multi-shot images 324 for use in the next iteration. First, in step 314, the updated multi-shot images 310 are used to construct spatial-shot matrices 316. There are multiple non-overlapped matrices to cover the whole field of view. Each of the spatial-shot matrices 316 corresponds to a spatial block in the imaging plane, where each column of each matrix corresponds to a different shot. This is illustrated in FIG. 5 and FIG. 6, where FIG. 5 shows a collection of multi-shot images 500 having $N_s$ shots, and FIG. 6 shows a corresponding matrix whose $N_s$ columns correspond to the $N_s$ shots. Each column is formed from the data in a block of pixels (e.g., 8×8 pixels) in one of the multi-shot images. Thus, the resulting spatial-shot matrix, denoted $R_b$, contains information from a spatial block at pixel index b in the image domain. With n pixels in one block, and $N_s$ shots, an $n \times N_s$ spatial-shot matrix is constructed, so that element $R_b \{x_1, \ldots, x_{N_s}\}_{i,j}$ represents the image at the $i^{th}$ pixel and $j^{th}$ shot.

Because the motion-induced phase is slowly varying in the image domain, the spatial-shot matrices are low-rank. This can be seen by decomposing the spatial-shot matrix into the product of two matrices (Eq. 1). Each element of the diagonal matrix I represents the target complex image without motion-induced phase. Matrix $\varphi$ contains the motion-induced phase $\theta$ of each shot.

$$R_b\{x_1,\ldots,x_{N_s}\} = \underbrace{\begin{bmatrix} I_1 & \cdots & 0 \\ \vdots & \ddots & \vdots \\ 0 & \cdots & I_n \end{bmatrix}}_{I} \underbrace{\begin{bmatrix} e^{i\theta_{1,1}} & \cdots & e^{i\theta_{1,N_s}} \\ \vdots & \ddots & \vdots \\ e^{i\theta_{n,1}} & \cdots & e^{i\theta_{n,N_s}} \end{bmatrix}}_{\varphi} \quad (1)$$

If the motion-induced phase θ is spatially smooth, the rank of matrix p is low. Consequently, $R_b\{x_1, \ldots, N_s\}$, which is the product of a diagonal matrix and a low-rank matrix, is also low-rank. Therefore, constraints on the rank of these matrices can be used to remove the phase inconsistency. So, returning to FIG. 3, in step 318, low-rank approximation is used to calculate updated low-rank spatial-shot matrices 320. This can be calculated for each matrix, for example, using singular value decomposition (SVD) to find the eigenvalues and soft-thresholding on the eigenvalues to get a low-rank approximation of the original matrix.

In step 322, these updated low-rank matrices are then reshaped into image blocks and concatenated to produce the current multi-shot images 324 for use in the next iteration where the multi-shot images are again updated by estimation step 308.

The updating of each multi-shot image in step 308 uses a gradient based on an encoding operator (i.e., data fidelity term) constructed from the sensitivity map, Fourier transform, and sampling operator. Given the current multi-shot image and acquired multi-shot data, the gradient can be calculated, and the images are updated by adding a scaling of the gradients to the current image.

In the present approach to reconstruction, the forward encoding model is combined with a constraint on the rank of $R_b\{x_1, \ldots, N_s\}$. The high computational complexity of the conventional non-convex rank penalty is reduced by replacing the rank constraint with its convex envelope, the nuclear norm, to make the optimization problem convex. The reconstruction may be formulated as the following optimization problem, $$P1: \min_{x_1,\ldots,N_s} \sum_{i=1}^{N_s} \|D_i FS x_i - y_i\|_2^2 + \lambda \sum_{b \in \Omega} \|R_b\{x_1,\ldots,N_s\}\|_* \quad (2)$$

where $D_i$ is the sampling operator, $x_i$ is the image shot i to be reconstructed, $y_i$ is the acquired k-space data of shot i, F is Fourier transform, S is the sensitivity map, λ is a regularization parameter, and Ω is the set of all non-overlapping blocks indexed by b which uniformly tile the image domain.

Some embodiments may use a decomposition of the spatial-shot matrix with virtual couch shift (VCS). With virtual shots, the total number of shots is doubled, and the new low-rank matrix can be formed and decomposed as follows:

$$R_b\{x_1,\ldots,2N_s\} = \begin{bmatrix} |I_1| & \cdots & 0 \\ \vdots & \ddots & \vdots \\ 0 & \cdots & |I_n| \end{bmatrix} \begin{bmatrix} e^{i(\theta_{1,1}+\beta_{1,1})} & \cdots & e^{i(\theta_{1,2*N_s}+\beta_{1,2N_s})} \\ \vdots & \ddots & \vdots \\ e^{i(\theta_{n,1}+\beta_{n,1})} & \cdots & e^{i(\theta_{n,2*N_s}+\beta_{n,2N_s})} \end{bmatrix}$$

where θ and β represent the motion-induced phase during diffusion encoding and the phase induced from $B_o$ inhomogeneity and other factors, respectively. Under the assumption that β is also spatially smooth, the low-rank property of $R_b\{x_1,\ldots,2N_s\}$ which includes both real and virtual shots still holds. This way, the final results will tend to have a smooth phase by adding a constraint on the rank of these matrices, and no other partial Fourier reconstruction is needed.

Using VCS, the reconstruction problem is formulated as follows:

$$P2: \min_{x_1,\ldots,2N_s} \sum_{i=1}^{2N_s} \|D_i FS x_i - y_i\|_2^2 + \lambda \sum_{b \in \Omega} \|R_b\{x_1,\ldots,N_s\}\|_*$$

Note that in this formulation there are $2N_s$ shots in total, including $N_s$ original shots and $N_s$ virtual conjugate shots. Sensitivity maps of real shots are the same as in P1, and for virtual shots, the maps are calculated from the flipped and conjugated reference data.

In this formulation of the reconstruction, coil sensitivity information is used to combine multi-channel images within one shot before forming the low-rank matrices, and the difference between different coil-combined images comes from the motion-induced phase instead of coil sensitivity encoding. As described above, Eq. 2 is solved using an iterative thresholding algorithm. The estimated images from all shots are then combined using complex averaging or root sum of square.

Embodiments of the invention may use virtual conjugate shots for shot-LLR with partial Fourier. Partial Fourier is commonly used in EPI to accelerate the acquisition or to acquire the central k-space earlier in the echo train. Partial Fourier reconstruction methods can be used to fill in the missing phase encoding lines after the shot-LLR reconstruction by employing the conjugate symmetric property of the k-space. Similar to the idea of virtual conjugate coils, which is an alternative way of exploiting this property, we generate virtual conjugate shots (VCS) by flipping and conjugating the acquired data, and treat them as additional shots to avoid the estimation of the low-resolution phase from the central k-space data.

As an illustrative example of the technique, data were acquired on a 3 Tesla (T) MRI system (Discovery MR750, GE Healthcare) using a 2D single-refocused to Stejskal-Tanner diffusion-weighted spin-echo EPI sequence. The number of shots may be 4 and 8, for example, and the b-value may be, for example, 1000 s/mm$^2$ or 600 s/mm$^2$.

The reconstruction technique of the present invention was implemented based on the open-source Berkeley Advanced Reconstruction Toolbox (BART) with a block size of 8×8. For comparison, the reconstruction results were compared to conventional POCS-MUSE and POCS-ICE techniques, which solved the following problem:

$$\min_{x, P_1,\ldots,N_s} \sum_i^{N_s} \|D_i FSP_i x - y_i\|_2^2 \quad (3)$$

where $P_i$ is the phase of shot i, and x is the final image to be reconstructed.

The number of iterations in the reconstruction was 200 for all methods in these examples. More generally, the number of iterations may be chosen empirically, to make sure all methods converge. For MRI reconstruction, this number usually ranges from 100 to 400. The k-space data were normalized first. The regularization parameter for the normalized data was 0.0008 for shot-LLR and 0.0004 for shot-LLR with VCS.

The image quality was evaluated visually based on the existence of aliasing artifacts, shading artifacts, and our knowledge of brain anatomy. It was found that shot-LLR and shot-LLR with VCS provided comparable image quality to POCS-MUSE and POCS-ICE for 4-shot acquisitions and markedly reduced aliasing artifact in comparison to POCS- MUSE and POCS-ICE for 8-shot acquisitions. All methods work similarly on 4-shot data, which demonstrates the capability of shot-LLR to solve the motion-induced phase mismatch problem without phase estimation. For 8-shot data, shot-LLR and shot-LLR with VCS significantly reduce aliasing artifacts compared with POCS-MUSE and POCS-ICE, despite the presence of areas of signal loss in shot-LLR and shot-LLR with VCS.

The results demonstrate that the techniques of the present invention are more motion robust compared to POCS-MUSE and POCS-ICE. If the data are not motion corrupted, all these methods work well and images from different acquisitions look consistent. Shot-LLR has significantly fewer artifacts, especially after averaging the resultant image from six acquisitions, which implies that it can handle more complicated phase variations between shots.

The increased SNR and reduced aliasing artifact achieved with shot-LLR are pronounced in the 8-shot images. Shot-LLR provides improved image quality and respective higher resolution, as well as decreased ghost artifacts versus POCS-MUSE and POCS-ICE. Compared with the single-shot image, the 8-shot acquisition and shot-LLR reconstruction together provide higher in-plane resolution (1 mm) and sharper boundaries for clinical evaluation.

In conclusion, embodiments provide a method for multi-shot diffusion-weighted MRI reconstruction. Spatial-shot matrices are constructed, and a convex model with a low-rank constraint on these matrices is used to avoid the challenging phase-estimation step. The method is shown to have the capability to reconstruct data from acquisitions with relatively high numbers of shots.

In some embodiments, external phase information can be also incorporated by including it in the sensitivity map, and this can further improve the performance. The following is one approach to implementing this. If we have some prior knowledge of the shot-to-shot phase variations, we can add a linear operator about those variations in the data fidelity term, i.e., in Eq. 2 above using $D_i FSP_i x_i$ instead of $D_i FS x_i$ and P is about the phase variations. This way, the spatial-shot matrices constructed from x after removing some phase variations can have better low-rank property.

It is envisioned that NUFFT or gridding may be used in some embodiments to make the method work with non-Cartesian data. This can be done by changing original Fourier transform operator F in the data consistency term to NUFFT.

It is envisioned that, in some embodiments, the methods may be extended to multi-slice or 3D data. For reconstruction of multi-slice data, one operator is added in the data fidelity term between sensitivity encoding operator S and Fourier transform operator F, which is about how different slices are combined in data acquisition. For reconstruction of multi-slice data, we use 3D Fourier transform instead of 2D in the data fidelity term.

For both, we extend the construction of spatial-shot matrices to 3D blocks (we are using 2D spatial blocks now). But this is optional.

It is envisioned that, in some embodiments, other constraints, such as $l_1$-norm, $l_2$-norm, or TV regularization terms may be added. This can be achieved by adding other regularization terms into our cost function. When the optimization problem is solved, the low-rank updated images are updated further based on those constraints.

It is envisioned that, in some embodiments, the techniques may be combined with navigator echo for increased robustness. The navigator may not be perfect, but it may be a good starting estimate or may be used in a regularization penalty. Navigator echo can be used to provide "external phase information".

It is envisioned that, in some embodiments, the technique can be combined with reduced motion sensitivity encoding methods such as CODE. Convex optimized diffusion encoding (CODE) can be used for diffusion encoding in data acquisition to reduce inter-shot variation. This way, the low-rank property of the spatial-shot matrices can be also improved.

It is envisioned that, in some embodiments, the technique can be applied to non-EPI methods such as diffusion-prepared spin-echo-train or other diffusion-prepared acquisitions. For reconstruction of data from other acquisition methods, like spin-echo train, only the sampling operator needs to be redefined based on the actual acquisition pattern.

The invention claimed is:

1. A method for multi-shot diffusion-weighted magnetic resonance imaging, the method comprising:
    a) acquiring with a magnetic resonance imaging system multiple k-space segments of diffusion-weighted MRI data;
    b) estimating reconstructed multi-shot diffusion weighted images by iteratively performing steps comprising:
        i) calculating updated multi-shot images from the multiple k-space segments and current multi-shot images using a convex model without estimating motion-induced phase;
        ii) constructing multiple locally low-rank spatial-shot matrices from the updated multi-shot images;
        iii) calculating the current multi-shot images from the spatial-shot matrices;
    c) combining the reconstructed multi-shot diffusion weighted images to obtain a reconstructed MRI image.

2. The method of claim 1 wherein the diffusion-weighted MRI data is acquired in response to an echo planar imaging sequence after applying diffusion encoding gradients.

3. The method of claim 2 wherein the echo planar imaging sequence is a 2D single-refocused Stejskal-Tanner spin-echo planar imaging sequence.

4. The method of claim 1 wherein constructing the spatial-shot matrices from the updated multi-shot image comprises calculating a low-rank approximation by doing singular value decomposition (SVD) and soft-thresholding.

5. The method of claim 1 where each of the spatial-shot matrices corresponds to a spatial block in an imaging plane, where each column of the matrix corresponds to a different shot of the multiple k-space segments.

6. The method of claim 1 where calculating updated multi-shot images uses a sampling operator, a Fourier transform, and an encoding operator constructed from sensitivity maps, and their conjugate operators, and the acquired data.

7. The method of claim 6 where the sensitivity maps are estimated from T2 images acquired without applying diffusion encoding gradients.

8. The method of claim 1 further comprising flipping and conjugating the multiple k-space segments of diffusion-weighted MRI data and treating them as virtual shots.

9. The method of claim 8 further comprising estimating sensitivity maps for the virtual shots from conjugated T2 images.

* * * * *